(12) United States Patent
Pires et al.

(10) Patent No.: US 10,822,932 B2
(45) Date of Patent: Nov. 3, 2020

(54) ACTIVE AND PASSIVE REFRIGERATION SYSTEMS FOR DOWNHOLE MOTORS

(71) Applicant: Baker Hughes, a GE Company, LLC, Houston, TX (US)

(72) Inventors: Juan Cruz Pires, Comodoro Rivadavia (AR); Martin Russo, Comodoro Rivadavia (AR); Ricardo Hector Teves, Comodoro Rivadavia (AR); Raul Alejandro Oyarzun, Comodoro Rivadavia (AR)

(73) Assignee: Baker Hughes, a GE Company, LLC, Houston, TX (US)

( * ) Notice: Subject to any disclaimer, the term of this patent is extended or adjusted under 35 U.S.C. 154(b) by 85 days.

(21) Appl. No.: 16/144,976

(22) Filed: Sep. 27, 2018

(65) Prior Publication Data

US 2019/0032459 A1 Jan. 31, 2019

Related U.S. Application Data

(63) Continuation-in-part of application No. 15/068,537, filed on Mar. 12, 2016, now Pat. No. 10,125,585.

(51) Int. Cl.
*E21B 43/12* (2006.01)
*H02K 9/19* (2006.01)
*H02K 5/20* (2006.01)
*F04D 13/10* (2006.01)
*H02K 5/128* (2006.01)
(Continued)

(52) U.S. Cl.
CPC ............ *E21B 43/128* (2013.01); *F04D 13/10* (2013.01); *H02K 5/20* (2013.01); *H02K 9/19* (2013.01); *F04D 29/5806* (2013.01); *H02K 5/1285* (2013.01); *H02K 5/132* (2013.01)

(58) Field of Classification Search
CPC .......... E21B 43/128; H02K 9/193; H02K 5/20
See application file for complete search history.

(56) References Cited

U.S. PATENT DOCUMENTS 4,685,867 A  8/1987 Patun et al.
5,828,149 A  * 10/1998 Parmeter ................. F16N 7/366
                                                            310/87

(Continued)

OTHER PUBLICATIONS

International Search Report and Written Opinion issued in connection with corresponding PCT Application No. PCT/US2019/053434 dated Dec. 3, 2019.

*Primary Examiner* — Brad Harcourt
(74) *Attorney, Agent, or Firm* — Crowe & Dunlevy

(57) ABSTRACT

A pumping system has a motor, a shaft assembly connected to the motor, a production pump connected to the shaft assembly and driven by the motor, an electrical generator connected to the shaft assembly and driven by the motor, an oil circulation pump connected to shaft assembly and driven by the motor, and a heat exchanger. The heat exchanger includes an outer housing, a heat exchange core inside the outer housing, a plurality of heat exchange fluid passages extending through the heat exchange core, and one or more thermoelectric cooling modules in contact with the outer housing and the heat exchange core. The one or more thermoelectric cooling modules are powered by the output from the electrical generator. The oil circulation pump circulates motor lubricant oil between the motor and the heat exchanger.

19 Claims, 7 Drawing Sheets

(51) Int. Cl.
    *F04D 29/58*     (2006.01)
    *H02K 5/132*     (2006.01)

(56) References Cited

U.S. PATENT DOCUMENTS

| | | |
|---|---|---|
| 2013/0091878 A1 | 4/2013 | Jankowski et al. |
| 2015/0064032 A1 | 3/2015 | Sadana et al. |
| 2015/0178887 A1 | 6/2015 | Kim et al. |
| 2017/0264170 A1 | 9/2017 | Oyarzun et al. |

* cited by examiner

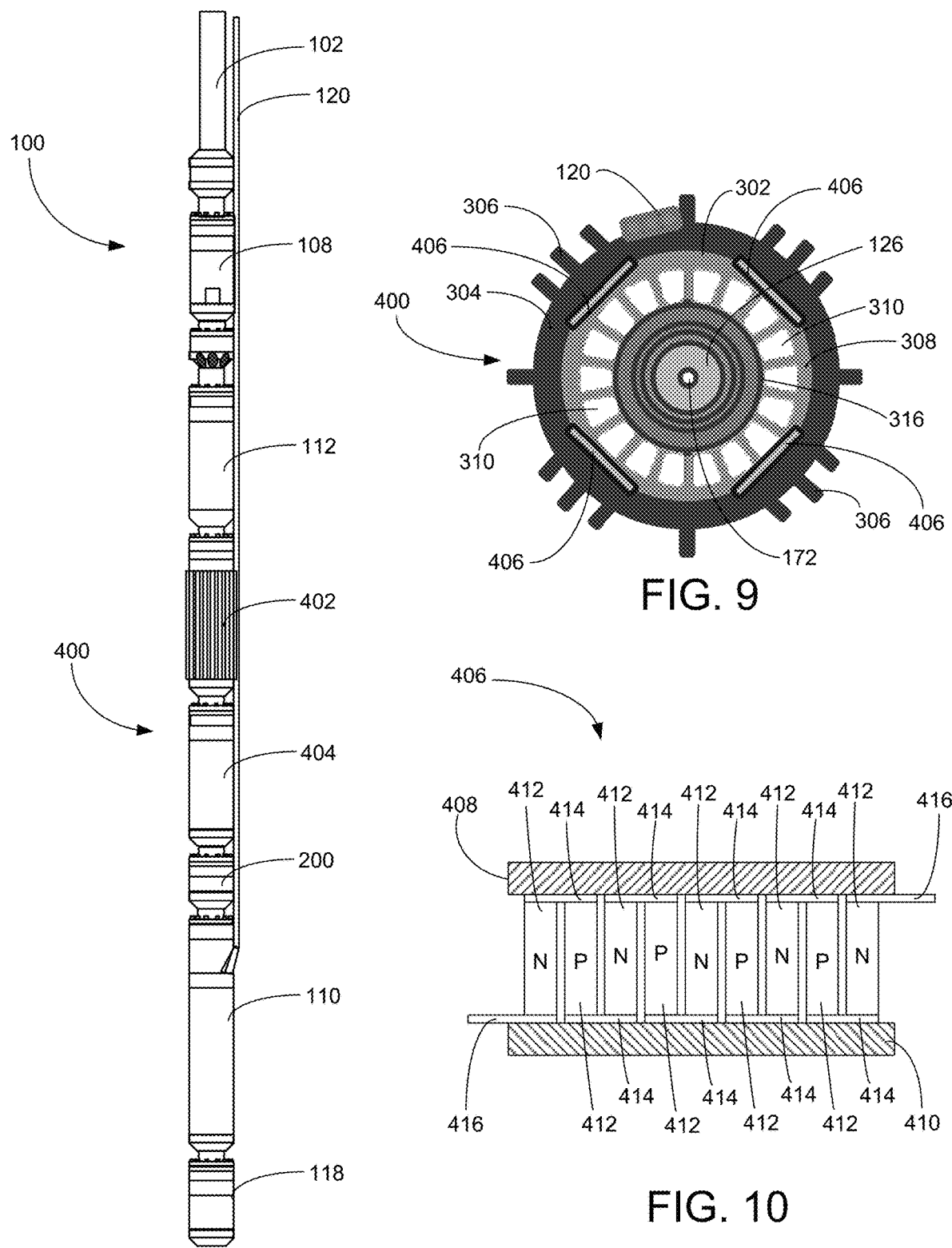

ACTIVE AND PASSIVE REFRIGERATION SYSTEMS FOR DOWNHOLE MOTORS

RELATED APPLICATIONS

This application is a continuation-in-part of U.S. patent application Ser. No. 15/068,537 filed Mar. 12, 2016 entitled "Refrigeration System with Internal Oil Circulation," the disclosure of which is herein incorporated by reference.

FIELD OF THE INVENTION

This invention relates generally to the field of submersible pumping systems, and more particularly, but not by way of limitation, to a submersible pumping system that includes a motor cooling system.

BACKGROUND

Submersible pumping systems are often deployed into wells to recover petroleum fluids from subterranean reservoirs. Typical submersible pumping systems include a number of components, including one or more fluid filled electric motors coupled to one or more high performance pumps located above the motor. When energized, the motor provides torque to the pump, which pushes wellbore fluids to the surface through production tubing. Each of the components in a submersible pumping system must be engineered to withstand the inhospitable downhole environment.

Most wells include a casing that extends along the inside of the wellbore to maintain the structural integrity of the wellbore and to isolate the introduction of fluids into the well. "Perforations" are formed through the casing at desired locations to permit the ingress of fluids from a producing formation into the casing. In many cases, the submersible pumping system is positioned above the perforations in the wellbore. By positioning the submersible pumping system above the perforations, a cooling effect is achieved as fluid drawn into the pump passes by the motor. In installations where insufficient fluid is available to provide this cooling effect, the electric motor may overheat and fail.

There are however, recognized benefits to installing at least a portion of the submersible pumping system below the perforations in what is occasionally referred to as a "sumped" position. By placing at least the intake of the pump below the perforations, the operator is able to maximize wellbore drawdown, which can increase the production of fluids from the well. In certain wells, the placement of the intake below the perforations also decreases the gas content present in the influent to the pump. As two-phase fluids enter the well through the perforations, lighter gaseous components tend to rise as the heavier liquid components fall. Placing the intake of the pump below the perforations enhances gravity separation and decreases the gas content in the pump influent. Reducing the gas content in the influent decreases the risks of gas locking and generally improves the efficiency of the submersible pumping system.

The primary problem associated with placing the submersible pumping system below the perforations is the lack of cooling provided by the movement of fluid over the electric motor. When the submersible pumping system is placed below the perforations, fluid entering the well through the perforations may be drawn into the pump intake without passing over the motor. In this way, the fluid around the motor may become relatively stagnant and unable to provide sufficient heat dissipation.

Manufacturers have used several methods to overcome this problem. The most common method for increasing flow around the electric motor is through the use of a shrouded intake. An intake shroud typically includes a closed end above the pump intake and an open end adjacent the bottom of the motor. As fluids are drawn into the wellbore through perforations, the fluids are conducted around the exterior of the motor by the shroud. While generally effective at providing a fluid flow around the motor, the shroud requires additional space between the submersible pumping system and the well casing and may present an undesirable pressure drop under certain conditions. Furthermore, the cooling effect provided by the shroud is dependent upon the availability of adequate liquid production into the wellbore. In marginal wells or wells with a high gas-fraction, the lack of sufficient quantities of liquid will reduce the cooling effect provided by a shrouded solution. There is, therefore, a need for an improved motor cooling system that overcomes the deficiencies of the prior art.

SUMMARY OF THE INVENTION

In exemplary embodiments, the present invention includes a pumping system deployable in a wellbore includes a motor, a production pump driven by the motor and a heat exchanger. The motor is filled with a motor lubricant oil. The heat exchange includes an outer housing, a heat exchange core and a plurality of heat exchange fluid passages extending through the heat exchange core. The outer housing has an exterior surface in contact with the wellbore and an interior surface. The heat exchange core is in contact with the interior surface of the outer housing. The pumping system also includes an internal oil circulation system that circulates the motor lubricant oil between the motor and the heat exchanger.

In another aspect, the exemplary embodiments include a pumping system that has a motor, a shaft connected to the motor for rotation, a production pump driven by the shaft and a heat exchanger. The heat exchanger includes an outer housing having an exterior surface in contact with the wellbore and an interior surface. The heat exchanger also includes a heat exchange core and a plurality of heat exchange fluid passages extending through the heat exchange core. The heat exchange core is in contact with the interior surface of the outer housing. The heat exchanger includes one or more thermoelectric cooling modules in contact with the outer housing and the heat exchange core. The pumping system also includes an internal oil circulation system that circulates motor lubricant oil between the motor and the heat exchanger.

In yet another aspect, the exemplary embodiments include a pumping system that has a motor, a shaft assembly connected to the motor, a production pump connected to the shaft assembly and driven by the motor, an electrical generator connected to the shaft assembly and driven by the motor, an oil circulation pump connected to shaft assembly and driven by the motor, and a heat exchanger. The heat exchanger includes an outer housing, a heat exchange core inside the outer housing, a plurality of heat exchange fluid passages extending through the heat exchange core, and one or more thermoelectric cooling modules in contact with the outer housing and the heat exchange core. The one or more thermoelectric cooling modules are powered by the output from the electrical generator.

BRIEF DESCRIPTION OF THE DRAWINGS

FIG. 8 is an elevational view of an embodiment of the pumping system that includes a thermoelectric cooling system.

FIG. 9 is a top cross-sectional view of the active heat exchanger from the pumping system of FIG. 8.

FIG. 10 is a side, partial cross-sectional view of a thermoelectric cooling module from the active heat exchanger of FIG. 9.

DETAILED DESCRIPTION

Figure 1:
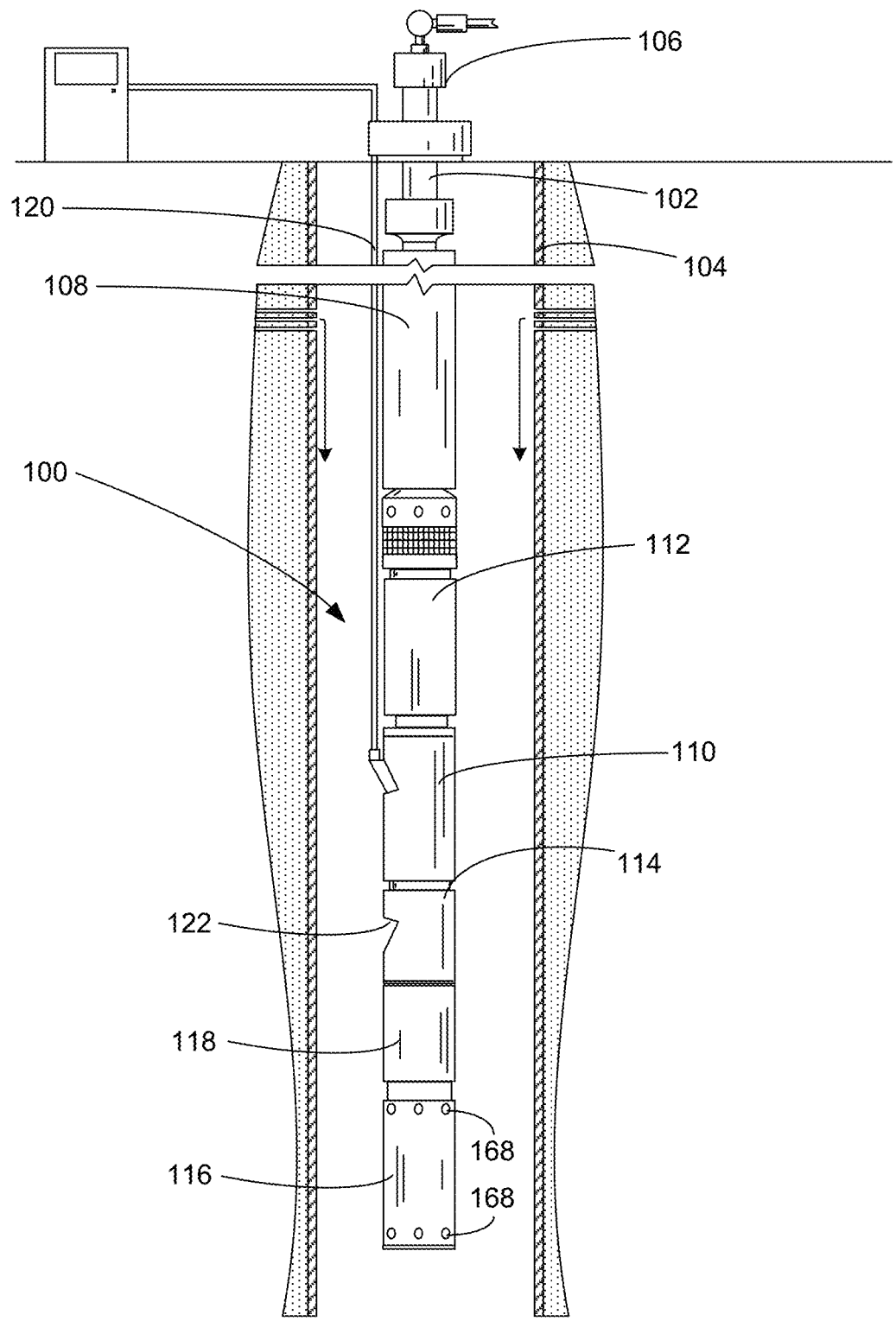
FIG. 1 is an elevational view of the submersible pumping system constructed in accordance with an embodiment of the present invention.

In accordance with an embodiment of the present invention, FIG. 1 shows an elevational view of a pumping system 100 attached to production tubing 102. The pumping system 100 and production tubing 102 are disposed in a wellbore 104, which is drilled for the production of a fluid such as water or petroleum. As used herein, the term "petroleum" refers broadly to all mineral hydrocarbons, such as crude oil, gas and combinations of oil and gas. The production tubing 102 connects the pumping system 100 to a wellhead 106 located on the surface.

The pumping system 100 includes a production pump 108, a motor 110, a seal section 112, a coupler 114, a heat exchanger 116 and an oil circulation pump 118. In an embodiment, the motor assembly 110 is an electrical motor that receives its power from a surface-based supply through a power cable 120. The motor assembly 110 converts the electrical energy into mechanical energy, which is transmitted to the production pump 108 by one or more shafts (not shown in FIG. 1). The production pump 108 then transfers a portion of this mechanical energy to fluids within the wellbore 104, causing the wellbore fluids to move through the production tubing 102 to the surface.

The production pump 108 is a turbomachine that uses one or more impellers and diffusers to convert mechanical energy into pressure head. In an alternative embodiment, the production pump 108 is a progressive cavity (PC) or positive displacement pump that moves wellbore fluids with one or more screws or pistons. Although demonstrated in a vertical wellbore 104, it will be appreciated that pumping system 100 may also be implemented in horizontal and non-vertical wellbores. Aspects of the pumping system 100 may also find utility in surface pumping applications and in the production of energy from geothermal resources.

The seal section 112 shields the motor 110 from axial thrust loading produced by the production pump 108 and prevent the ingress of wellbore fluids into the motor 110. The seal section 112 may also accommodate expansion and contraction of lubricants within the motor 110.

The coupler 114 provides a connection between the motor 110 and the oil circulation pump 118. In some embodiments, the coupler 114 includes a socket 122 that is connected to the electrical connections within the motor 110. The socket 122 can be used for connecting sensors or additional powered components within the pumping system 100.

Generally, the heat exchanger 116 and oil circulation pump 118 are configured to cooperatively remove heat from the motor 110. Motor lubricants from the motor 110 are pumped by the oil circulation pump 118 through the heat exchanger 116. The motor lubricants absorb heat from the motor 110 and expel heat in the heat exchanger 116. As explained below, the motor lubricants are carried between the motor 110 and heat exchanger 116 through conduits internal to the pumping system 100.

The use of the heat exchanger 116 and oil circulation pump 118 presents a significant advance in the maintenance of motor temperatures, particularly when the motor 110 is positioned near the bottom of the wellbore 104. Because the motor cooling system is not dependent on external convective cooling, the motor 110 can be operated in environments with reduced fluid flow around the motor 110. In particular, the novel motor cooling systems will find particular utility in situations where the motor 110 is placed below the perforations in the wellbore 104 (as illustrated in FIG. 1) or in marginal wells that do not produce sufficient fluid volume for external convective cooling.

Although only one production pump 108, motor 110, seal section 112, coupler 114, heat exchanger 116 and oil circulation pump 118 are shown in FIG. 1, it will be understood that more than one of each of these components can be utilized within the pumping system 100 when appropriate.

Figure 2:
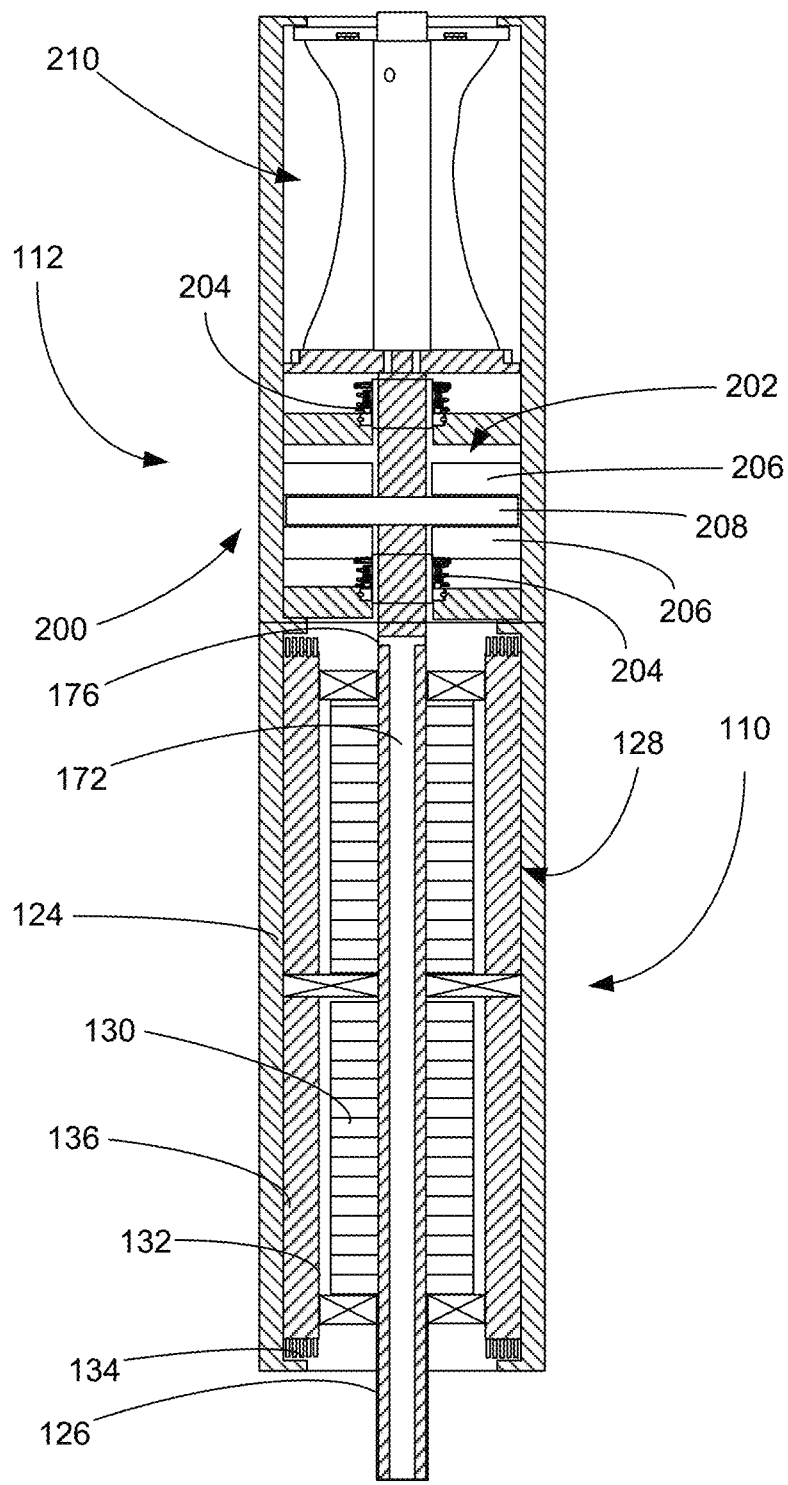
FIG. 2 is a cross-sectional depiction of the motor of the pumping system of FIG. 1.

Referring now to FIG. 2, shown therein is a side cross-sectional view of the motor 110 and seal section 112. The motor 110 includes a motor housing 124, a shaft 126, a stator assembly 128, and a rotor 130. The motor housing 124 encompasses and protects the internal portions of the motor 110. The bottom of the motor 110 is connected to, and in fluid communication with, the coupler 114 and oil circulation pump 118. The shaft 126 may include a series of interconnected individual shafts that extend through the various components of the pumping system 100.

The seal section 112 is attached to the upper end of the motor 110 and provides a system for accommodating the thrust load of the production pump 108. The seal section 112 includes a thrust chamber 200 that houses a thrust bearing assembly 202 and one or more mechanical seals 204. The thrust bearing assembly 202 includes a pair of stationary bearings 206 and a thrust runner 208 attached to the shaft 126. The thrust runner 208 is captured between the stationary bearings 206, which limit the axial displacement of the thrust runner 208 and the shaft 126. The seal section 112 also includes a fluid isolation assembly 210. The fluid isolation assembly 210 may include a one or more separation mechanisms, such as bag seals, labyrinth seals and piston seals. The fluid isolation assembly 210 is used to isolate wellbore fluids in the production pump 108 from the clean lubricants in the seal section 112 and motor 110.

Adjacent the interior surface of the motor housing 124 is the stationary stator assembly 128 that remains fixed relative the motor housing 124. The stator assembly 128 surrounds the interior rotor 130. The difference between the interior diameter of the stator assembly 128 and the outer diameter of the rotor 130 defines a stator-rotor gap 132 that extends along the length of the rotor 130.

Figure 3:
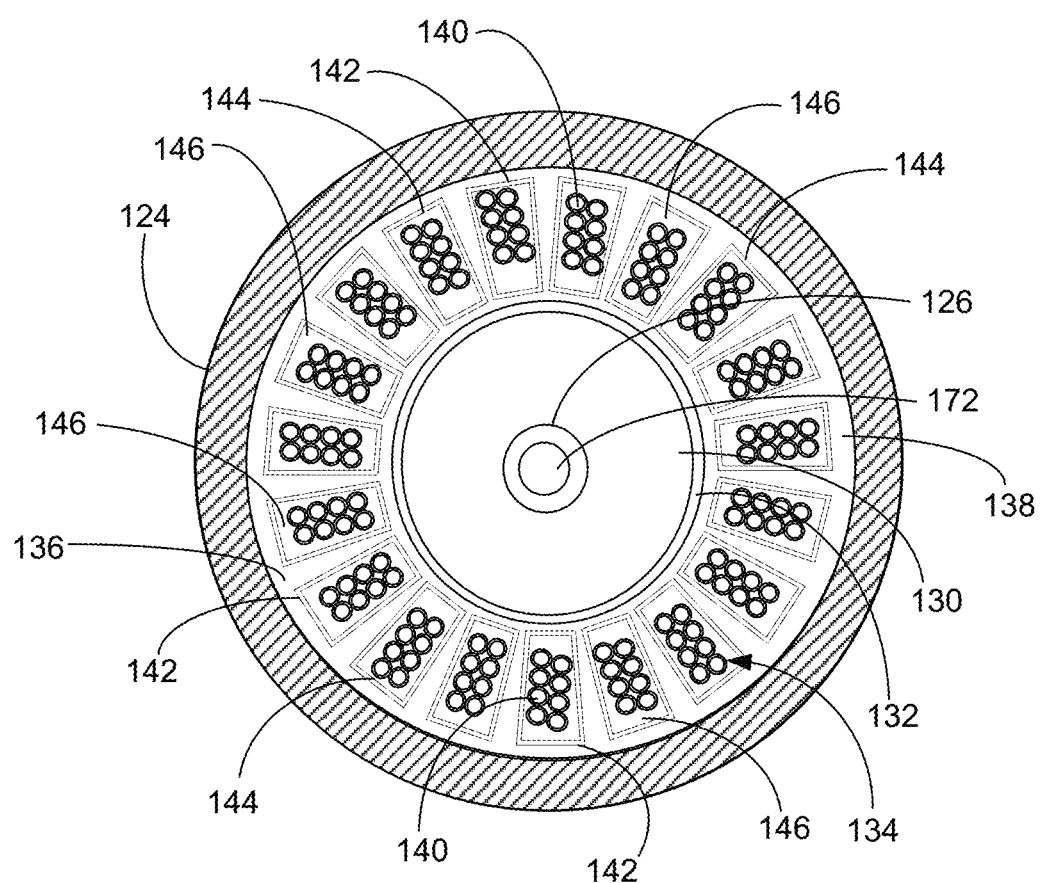
FIG. 3 is a top cross-sectional view of the motor of FIG. 2.

As also depicted in the cross-sectional view of the motor in FIG. 3, the stator assembly 128 includes stator coils 134 extending through a stator core 136. The stator core 136 is formed by stacking and pressing a number of thin laminates 138 to create an effectively solid core. The stator coils 134 are formed by extending magnet wire 140 through slots 142 in each laminate 138 of the stator core 136. The magnet wire 140 is insulated from the laminates 138 by slot liners 144. The slot liners are manufactured from a durable, electrically isolating material, such as perfluoroalkoxy (PFA) polymer. The cross-sectional area of the interior of each of the slot liners 144 is greater than the combined cross-sectional area of the multiple passes of magnet wire 140 within each slot liner 144. The difference between the cross-sectional area of the slot liner 144 and the aggregate cross-sectional area of the magnet wire 140 defines a stator slot oil passage 146 that is filled with dielectric motor lubricating oil.

Figure 4:
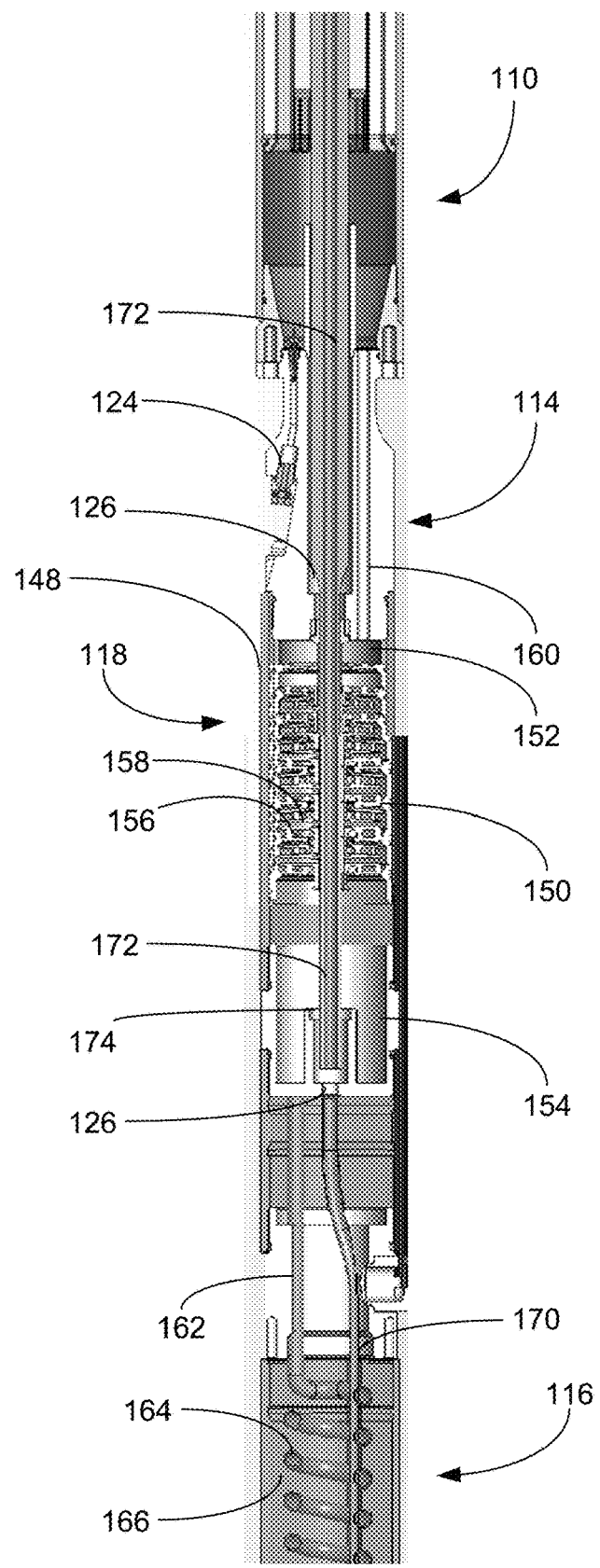
FIG. 4 is a cross-sectional view of the pumping system of FIG. 1 showing a portion of the motor, the coupler, the oil circulation pump and a portion of the heat exchanger.

Turning to FIG. 4, shown therein is a cross-sectional depiction of an embodiment of the oil circulation pump 118, coupler 114 and a portion of the motor 110 and the heat exchanger 116. The oil circulation pump 118 includes a circulation pump housing 148 that is connected to the coupler 114 and to the heat exchanger 116. The oil circulation pump 118 includes one or more pump stages 150, a pump intake 152 and a pump discharge 154. Each of the one or more pump stages 150 is a turbomachine that includes a stationary diffuser 156 and a rotatable impeller 158 that is connected to the motor shaft 126. When rotated by the motor 110, the pump impellers 158 push the motor lubricant through the oil circulation pump 118. In alternative embodiments, the oil circulation pump 118 includes rotary or reciprocating positive displacement pump stages.

The coupler 114 includes a lubricant passage 160 that connects the lower end of the motor 110 to the pump intake 152. The lubricant passage 160 transfers motor lubricant from the bottom of the motor 110 through the coupler 114 to the oil circulation pump 118. The oil circulation pump 118 pushes the motor lubricant from the coupler 114 out of the discharge 154 and into the heat exchanger 116.

The heat exchanger 116 includes an inlet 162 that is in fluid communication with the discharge 154 of the oil circulation pump 118. The inlet 162 carries pressurized motor lubricant into the heat exchanger 116. In an embodiment, the heat exchanger 116 includes a series of tubing coils 164 disposed within a coolant shell 166. The coolant shell 166 may be in fluid communication with the wellbore 104 through vents 168 (shown in FIG. 1) and the wellbore fluids can actively or passively circulate through the coolant shell 166. Alternatively, or the shell 166 may include a cooling fluid that is isolated from the wellbore 104. It will be appreciated that other embodiments include the use of alternative forms and configurations of heat exchangers 116.

Motor lubricant is carried out of the heat exchanger 116 through an outlet 170. The outlet 170 terminates adjacent the shaft 126. The shaft 126 includes a central passage 172 that extends through the center of the shaft 126. A shaft seal 174 within the discharge 154 of the oil circulation pump 118 prevents higher pressure fluid in the discharge 154 from entering the outlet 170 or central passage 172. The central passage 172 extends through the shaft 126 into an upper region of the motor 110 (shown in FIG. 2). The shaft 126 may include discharge ports 176 that expel motor lubricant from the central passage 172 into the upper region of the motor 110 (as shown in FIG. 2).

In some embodiments, hot motor lubricant is drawn downward out of the motor 110 through the lubricant passage 160 into the oil circulation pump 118. The motor lubricant is pressurized in the oil circulation pump 118 and discharged into the inlet 162 of the heat exchanger 116. The pressurized motor lubricant passes through the heat exchanger 116, where it transfers heat to fluid in the coolant shell 166. The cooled motor lubricant is then returned to the top of the motor 110 through the outlet 170 of the heat exchanger 116, central passage 172 of the shaft 126, and discharge ports 176 of the shaft 126.

In this way, the pumping system 100 includes an internal oil circulation system 178 which includes some or all of the following components: the stator slot oil passages 146 and the stator-rotor gap 132 in the motor 110, the lubricant passage 160 in the coupler 114, the pump stages 150 of the oil circulation pump, the inlet 162, tubing coils 164 and outlet 166 of the heat exchanger 116, and the central passage 172 of the shaft 126. The internal oil circulation system 178 thus provides a mechanism for circulating motor lubricant between the motor 110 and the heat exchanger 116 without the use of external conduits or conduits that are exposed directly to the wellbore 104.

Figure 5:
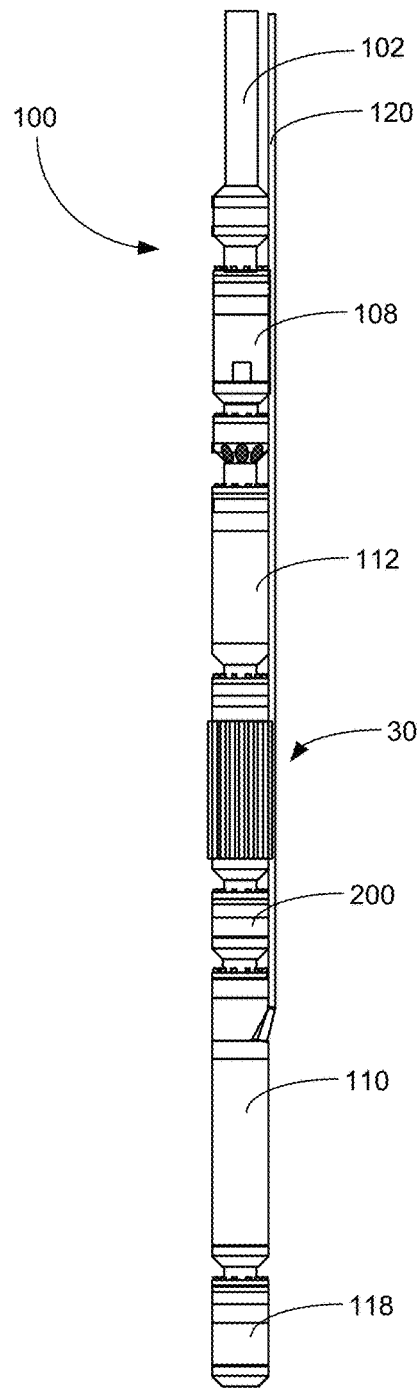
FIG. 5 is an elevational view of an embodiment of the pumping system that includes a passive heat exchanger.
Figure 6:
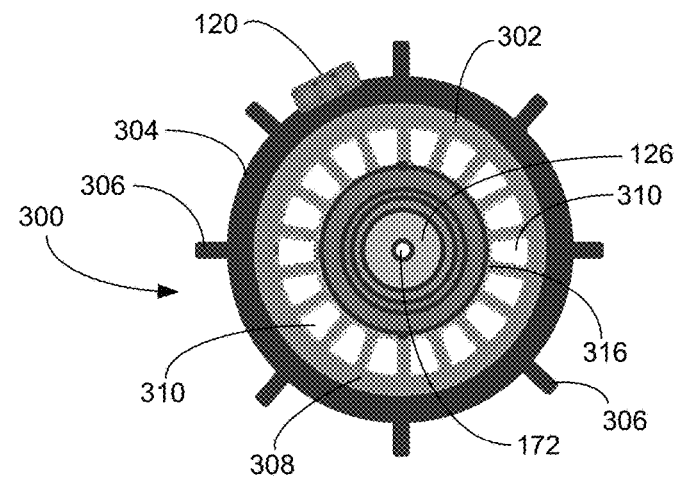
FIG. 6 is a top cross-sectional view of the passive heat exchanger from the pumping system of FIG. 5.
Figure 7:
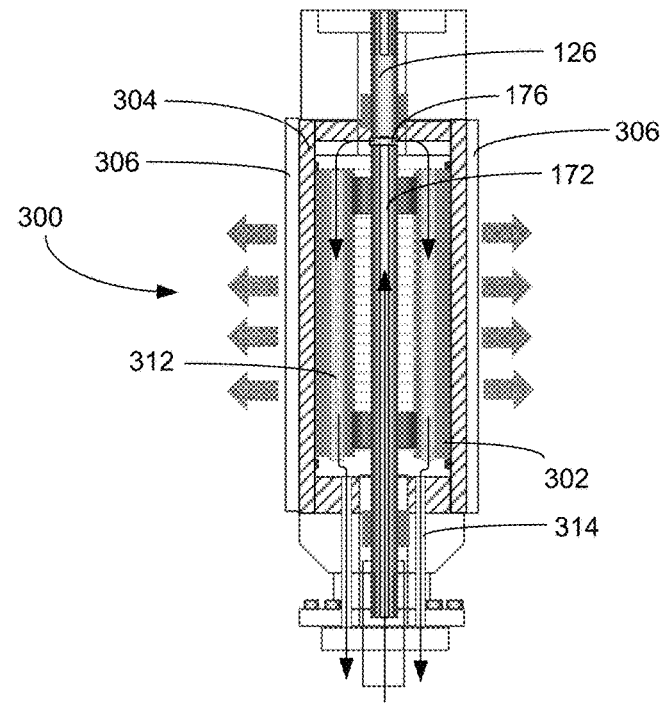
FIG. 7 is a side cross-sectional view of the passive heat exchanger of FIG. 6.

Turning to FIGS. 5-7, shown therein is an embodiment of the pumping system 100 that includes a passive heat exchanger 300. Unlike the embodiments depicted in FIG. 1-4, the oil circulation pump 118 is positioned below the motor 110. The passive heat exchanger 300 is connected between the seal section 112 and the motor 110. The production pump 108 is positioned on top of the seal section 112. In some variations, the thrust chamber 200 is positioned between the passive heat exchanger 300 and the motor 110. In other embodiments, the thrust chamber 200 is integrated within the motor 110.

FIGS. 6 and 7 provide top and side cross-sectional views, respectively, of the passive heat exchanger 300. The passive heat exchanger 300 includes a heat exchange core 302 contained within an outer housing 304. The housing 304 includes a plurality of fins 306 that extend along at least a portion of the length of housing 304. Although eight fins 306 are shown in FIG. 6, it will be appreciated that greater or fewer fins 306 are contemplated within the scope of the exemplary embodiments.

The heat exchange core 302 can be manufactured by pressing together a number of individual heat exchange laminates 308 into a substantially solid core. Each of the heat exchange laminates 308 includes a plurality of heat exchange slots 310 that are aligned to form heat exchange fluid passages 312. As illustrated in FIG. 6, the passive heat exchanger 300 includes heat exchange discharge ports 314 that provide a return path to the motor 110 or thrust chamber 200. Each of the heat exchange laminates 308 includes a central aperture 316 that accommodates the placement of the shaft 126 and shaft bearings.

In some embodiments, the heat exchange laminates 308 of the heat exchange core 302 are the same or similar to the laminates 138 of the stator core 136 of the motor 110. It will be appreciated, however, that the heat exchange core 302 does not include magnet wire 140 or slot liners 144 within the heat exchange slots 310. The heat exchange core 302 can be manufactured from copper, brass, or other metal or metal alloy that exhibits favorable heat transfer properties.

During operation of the pumping system 100, dielectric motor lubricant is drawn through the motor 110, where the motor lubricant is heated as it passes through the stator-rotor gap 132 and stator slot oil passages 146. The hot motor lubricant is then pumped by the oil circulation pump 118 through the central passage 172 of the shaft 126 to the passive heat exchanger 300. The motor lubricant is discharged into the passive heat exchanger 300 through the discharge ports 176 in the shaft 126. The motor lubricant is then directed through the heat exchange fluid passages 312 in the heat exchange core 302. The heat exchange core 302 is passively cooled through contact with the outer housing 304 and fins 306. The heat exchange core 302 absorbs heat from the motor lubricant and conducts the heat to the wellbore 104 through the outer housing 304 and fins 306.

In this way, the passive heat exchanger 300 seeks to balance the temperature of the fluids in the wellbore 104 with the hot motor lubricant. Notably, the passive core heat exchanger 300 does not include a shell-and-tube design in which wellbore fluids are drawn into the passive heat exchanger 300. Instead, the passive heat exchanger 300 resembles a plate-fin design in which heat is conducted through the slotted heat exchanger core 302 to the outer housing 304 and fins 306, where it is dissipated through convection with wellbore fluids at ambient temperatures.

Turning to FIGS. 8-11, shown therein is an embodiment of the pumping system 100 that includes a thermoelectric cooling system 400. Like the embodiments depicted in FIGS. 5-7, the oil circulation pump 118 can be positioned below the motor 110. The thermoelectric cooling system 400 is connected between the seal section 112 and the motor 110. The production pump 108 is positioned on top of the seal section 112. In some variations, the thrust chamber 200 is positioned between the thermoelectric cooling system 400 and the motor 110. In other embodiments, the thrust chamber 200 is integrated within the motor 110.

In exemplary embodiments, the thermoelectric cooling system 400 includes an active heat exchanger 402 and a DC (direct current) generator 404. The active heat exchanger 402 resembles the passive heat exchanger 300. The active heat exchanger 402 includes the heat exchange core 302 constructed from a stack of laminates 308 that form the heat exchange fluid passages 312 when the heat exchange slots 310 are aligned. Unlike the passive heat exchanger 300, however, the active heat exchanger 402 includes one or more thermoelectric cooling modules 406 embedded within the heat exchange core 302, the outer housing 304, or in both at the interface between the slotted heat exchanger core 302 and outer housing 304. Although four thermodynamic cooling modules 406 are depicted in FIG. 9, it will be appreciated that greater or fewer thermodynamic cooling modules 406 could be used and that the size and shape of the thermodynamic cooling modules 406 may change depending on the demands of a particular application. In some applications, two or more thermodynamic cooling modules 406 may be stacked radially together within the heat exchange core 302 and outer housing 304 to amplify the transfer of heat from the heat exchange core 302 to the outer housing 304.

As noted in FIG. 10, each thermoelectric cooling module 406 includes a hot-side plate 408, a cold-side plate 410, and a plurality of thermoelectric elements 412 between the hot-side plate 408 and cold-side plate 410. In exemplary embodiments, the hot-side plate 408 is placed in contact with an outer portion of the heat exchange core 302, while the cold-side plate 410 is placed in contact with an inner portion of the outer housing 304. The hot-side plate 408 and cold-side plate 410 can be constructed from a thermally conductive ceramic or metal material. In some embodiments, the hot-side plate 408, cold-side plate 410 and thermodynamic elements 412 are sized and configured to produce a curved profile that approximates the cylindrical form of the heat exchange core 302 and outer housing 304.

Each of the thermoelectric elements 412 is constructed from a p-type or n-type semiconductor and connected to an adjacent one of the thermoelectric elements 412 with a conductive interconnect 414. Electrical leads 416 are used to provide current to the thermoelectric elements 412. The thermoelectric elements 412 are arranged in a series electrical connection that establishes a parallel thermodynamic configuration in accordance with the well-established Peltier effect. When a voltage is applied across the electrical leads 416, the thermoelectric cooling modules 406 produce a heat flux to forcibly convey heat from the hot-side plate 408 through the thermoelectric cooling module 406 to the cold-side plate 410.

Figure 11:
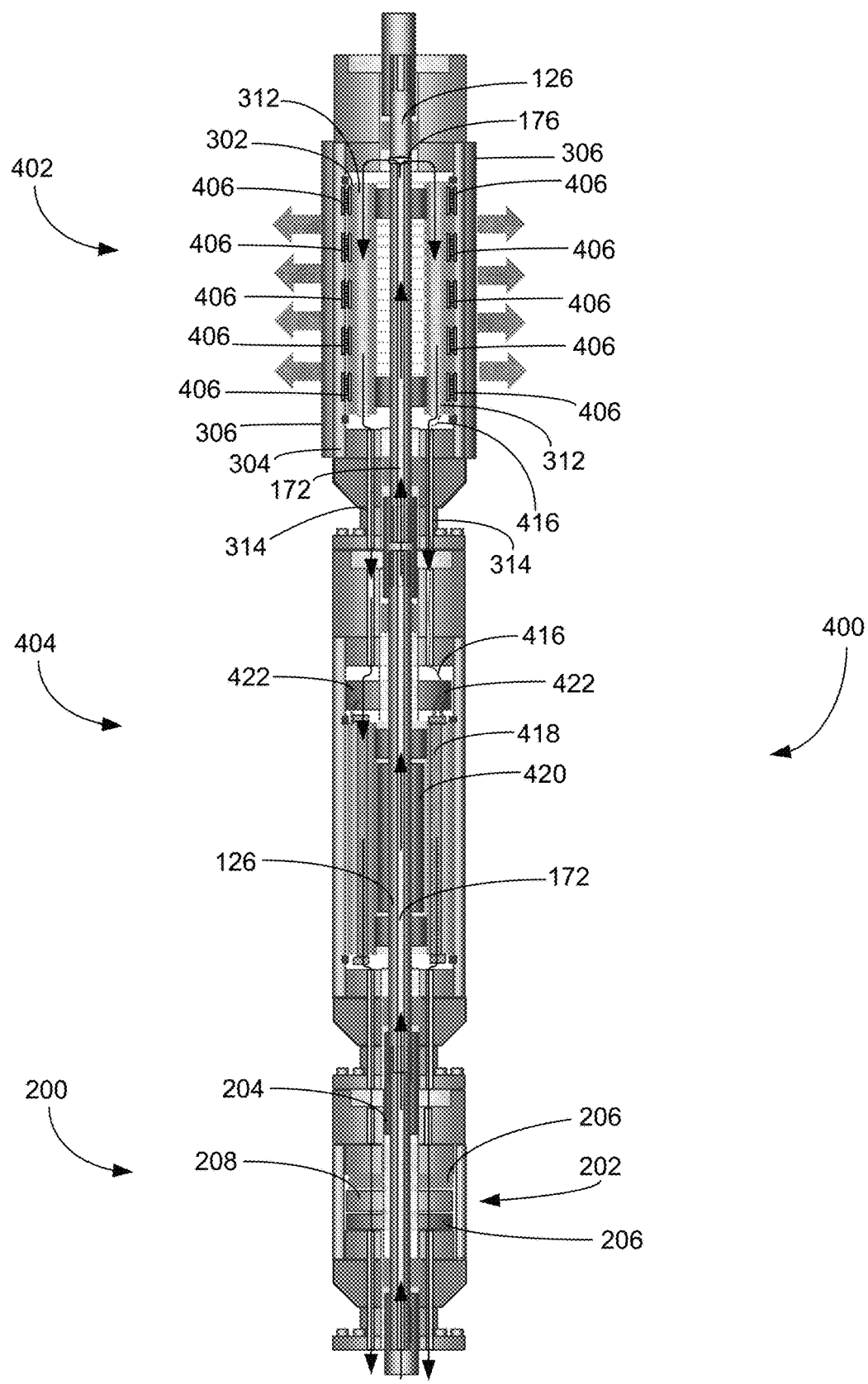
FIG. 11 is a side cross-sectional view of the thermoelectric cooling system from the pumping system depicted in FIG. 8.

Turning to FIG. 11, shown therein is a cross-section depiction of the thermoelectric cooling system 400. In this embodiment, the current used to drive the thermoelectric cooling modules 406 is produced by the DC generator 404. The DC generator includes a stationary armature 418 and a permanent magnet rotor 420 connected to the shaft 126. As the permanent magnet rotor 420 spins, it induces a three-phase alternating current in the armature 418. A rectifier 422 converts the three-phase alternating current to the direct current (DC) used to drive the thermoelectric cooling modules 406. In exemplary embodiments, the rectifier 422 is a high temperature silicon carbide diode. The rectified output from the DC generator 404 is provided to the electrical leads 416 of the thermoelectric cooling modules 406. In other embodiments, the current used to drive the thermoelectric cooling modules is produced at the surface and delivered through the power cable 120 (in AC or DC form) to the thermoelectric cooling system 400, either directly or through the rectifier 422.

When the pumping system 100 is in use, dielectric motor lubricant is drawn through the motor 110 where the motor lubricant is heated as it passes through the stator-rotor gap 132 and stator slot oil passages 146. The hot motor lubricant is then pumped by the oil recirculation pump 118 through the central passage 172 of the shaft 126 to the thermoelectric cooling system 400, where it is discharged into the active heat exchanger 402 through the discharge ports 176 in the shaft 126. The motor lubricant is then directed through the heat exchange fluid passages 312 in the heat exchange core 302.

As the motor lubricant passes through the heat exchange core 302, the thermoelectric cooling modules 406 actively removes heat from the heat exchange core 302 to the outer housing 304 to more significantly cool the motor lubricant. The thermoelectric cooling modules 406 are energized by a DC signal produced by the DC generator 404 or delivered from surface facilities on the power cable 120. The cooled motor lubricant is directed from the active heat exchanger 402 through the heat exchange fluid discharge ports 314 into the DC generator 404, thrust chamber 200 and motor 110. Cooling the DC generator 404 and thrust chamber 200 improves the performance and durability of these components.

It is to be understood that even though numerous characteristics and advantages of various embodiments of the present invention have been set forth in the foregoing description, together with details of the structure and functions of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. It will be appreciated by those skilled in the art that the teachings of the present invention can be applied to other systems without departing from the scope and spirit of the present invention.

What is claimed is:

1. A pumping system deployable in a wellbore, the pumping system comprising:
   a motor, wherein the motor is filled with a motor lubricant oil;
   a production pump driven by the motor;
   a heat exchanger, wherein the heat exchanger comprises:
      an outer housing having an exterior surface in contact with the wellbore and an interior surface;
      a plurality of fins extending outward from the exterior surface of the outer housing;
      a heat exchange core inside the outer housing, wherein the heat exchange core is in contact with the interior surface of the outer housing; and
      a plurality of heat exchange fluid passages extending through the heat exchange core; and
   an internal oil circulation system contained within the pumping system, wherein the internal oil circulation system circulates the motor lubricant oil between the motor and the heat exchanger.

2. The pumping system of claim 1, wherein the heat exchange core comprises a plurality of laminates, wherein each of the laminates includes a plurality of heat exchange slots that form the plurality of heat exchange fluid passages when the plurality of laminates are aligned and stacked together.

3. The pumping system of claim 2, wherein each of the plurality of laminates is selected from the group consisting of copper and bronze metals.

4. The pumping system of claim 1, wherein the heat exchanger further comprises one or more thermoelectric cooling modules in contact with the outer housing and the heat exchange core.

5. The pumping system of claim 4, further comprising an electrical generator that produces electrical current to drive the one or more thermoelectric cooling modules.

6. The pumping system of claim 5, wherein the electrical generator comprises:
   a permanent magnet rotor;
   a stationary armature; and
   a rectifier connected to the stationary armature, wherein the rectifier is configured to produce a direct current signal.

7. The pumping system of claim 4, wherein each of the one or more thermoelectric cooling modules comprises:
   a hot-side plate;
   a cold-side plate; and
   a plurality of thermoelectric elements extending between the hot-side plate and the cold-side plate.

8. The pumping system of claim 7, wherein the hot-side plate and the cold-side plate are shaped to match the outer housing and heat exchange core.

9. The pumping system of claim 1, wherein the internal oil circulation system comprises an oil circulation pump driven by the motor.

10. The pumping system of claim 9, wherein the oil circulation pump comprises:
    a pump intake;
    one or more pump stages; and
    a pump discharge.

11. A pumping system deployable in a wellbore, the pumping system comprising:
    a motor, wherein the motor is filled with a motor lubricant oil;
    a shaft connected to the motor for rotation, wherein the shaft comprises one or more interconnected shafts;
    a production pump driven by the shaft;
    a heat exchanger, wherein the heat exchanger comprises:
       an outer housing having an exterior surface in contact with the wellbore and an interior surface;
       a heat exchange core inside the outer housing, wherein the heat exchange core is in contact with the interior surface of the outer housing;
       a plurality of heat exchange fluid passages extending through the heat exchange core; and
       one or more thermoelectric cooling modules in contact with the outer housing and the heat exchange core; and
    an internal oil circulation system contained within the pumping system, wherein the internal oil circulation system circulates the motor lubricant oil between the motor and the heat exchanger.

12. The pumping system of claim 11, wherein each of the one or more thermoelectric cooling modules comprises:
    a hot-side plate;
    a cold-side plate; and
    a plurality of thermoelectric elements extending between the hot-side plate and the cold-side plate.

13. The pumping system of claim 12, wherein the hot-side plate and the cold-side plate are shaped to match the outer housing and heat exchange core.

14. The pumping system of claim 11, wherein the heat exchange core comprises a plurality of laminates, wherein each of the laminates includes a plurality of heat exchange slots that form the plurality of heat exchange fluid passages when the plurality of laminates are aligned and stacked together.

15. The pumping system of claim 11, further comprising an electrical generator that produces electrical current to drive the one or more thermoelectric cooling modules.

16. The pumping system of claim 15, wherein the electrical generator comprises:
    a permanent magnet rotor comprising a permanent magnet connected for rotation with the shaft;
    a stationary armature surrounding the permanent magnet rotor; and
    a rectifier connected to the stationary armature, wherein the rectifier is configured to produce a direct current signal.

17. The pumping system of claim 11, wherein the internal oil circulation system comprises an oil circulation pump driven by the motor.

18. A pumping system deployable in a wellbore, the pumping system comprising:
    a motor, wherein the motor is filled with a motor lubricant oil;
    a shaft assembly connected to the motor, wherein the shaft assembly includes a plurality of interconnected rotatable shafts;
    a production pump connected to the shaft assembly and driven by the motor;
    an electrical generator connected to the shaft assembly and driven by the motor, wherein the electrical generator includes electrical leads;
    an oil circulation pump connected to shaft assembly and driven by the motor;
    a heat exchanger, wherein the heat exchanger comprises:
       an outer housing having an exterior surface in contact with the wellbore and an interior surface;
       a heat exchange core inside the outer housing, wherein the heat exchange core is in contact with the interior surface of the outer housing;
       a plurality of heat exchange fluid passages extending through the heat exchange core; and one or more thermoelectric cooling modules in contact with the outer housing and the heat exchange core, wherein the one or more thermoelectric cooling modules are connected to the leads from the electrical generator.

19. The pumping system of claim 18, wherein each of the one or more thermoelectric cooling modules comprises:
a hot-side plate, wherein the hot-side plate is shaped to match the heat exchange core;
a cold-side plate, wherein the cold-side plate is shaped to match the heat exchange core; and
a plurality of thermoelectric elements extending between the hot-side plate and the cold-side plate.

* * * * *